US009373683B2

(12) United States Patent
 Chiang et al.

(10) Patent No.: US 9,373,683 B2
(45) Date of Patent: Jun. 21, 2016

(54) THIN FILM TRANSISTOR

(71) Applicant: Chunghwa Picture Tubes, LTD., Taoyuan County (TW)

(72) Inventors: Shin-Chuan Chiang, Taipei (TW); En-Chih Liu, Taoyuan (TW); Yu-Hsien Chen, Hsinchu (TW); Ya-Ju Lu, New Taipei (TW); Yen-Yu Huang, Taoyuan (TW)

(73) Assignee: Chunghwa Picture Tubes, LTD., Taoyuan (TW)

( * ) Notice: Subject to any disclaimer, the term of this patent is extended or adjusted under 35 U.S.C. 154(b) by 0 days.

(21) Appl. No.: 14/506,693

(22) Filed: Oct. 6, 2014

(65) Prior Publication Data
 US 2016/0027873 A1    Jan. 28, 2016

(30) Foreign Application Priority Data
 Jul. 22, 2014  (TW) .............................. 103125087 A

(51) Int. Cl.
 *H01L 29/08*  (2006.01)
 *H01L 29/786*  (2006.01)

(52) U.S. Cl.
 CPC .......... *H01L 29/0847* (2013.01); *H01L 29/786* (2013.01)

(58) Field of Classification Search
 CPC ............ H01L 29/786; H01L 29/41725; H01L 29/41733; H01L 29/458
 See application file for complete search history.

(56) References Cited

U.S. PATENT DOCUMENTS

| 2005/0104097 | A1* | 5/2005 | Hirose et al. ................... 257/288 |
| 2007/0007515 | A1* | 1/2007 | Suh ...................... H01L 27/3246 257/40 |
| 2010/0148168 | A1* | 6/2010 | Lai et al. ......................... 257/43 |
| 2010/0200851 | A1 | 8/2010 | Oikawa et al. |
| 2010/0207120 | A1* | 8/2010 | Kimura ................. H01L 29/105 257/57 |
| 2013/0069067 | A1* | 3/2013 | Youn ................... H01L 27/3279 257/59 |
| 2014/0159034 | A1* | 6/2014 | Yang .............................. 257/43 |
| 2014/0231764 | A1* | 8/2014 | Park et al. ....................... 257/40 |

* cited by examiner

*Primary Examiner* — Su C Kim
*Assistant Examiner* — David S Wilbert
(74) *Attorney, Agent, or Firm* — Jianq Chyun IP Office

(57) ABSTRACT

The thin film transistor includes a gate, a gate insulating layer, a semiconductor layer, and a source and a drain. The gate insulating layer covers the gate. The semiconductor layer is located on the gate insulating layer which is disposed above the gate. The source and the drain are disposed above the gate insulating layer and are electrically connected to the semiconductor layer, respectively. The source and the drain are respectively located in different layers. A first contact resistance is existed between the semiconductor layer and the source, a second contact resistance is existed between the semiconductor layer and the drain, and. the first contact resistance is less than the second contact resistance.

4 Claims, 11 Drawing Sheets

THIN FILM TRANSISTOR

CROSS-REFERENCE TO RELATED APPLICATION

This application claims the priority benefit of Taiwan application serial no. 103125087, filed on Jul. 22, 2014. The entirety of the above-mentioned patent application is hereby incorporated by reference herein and made a part of this specification.

BACKGROUND OF THE INVENTION

1. Field of the Invention

The invention relates to an electronic device, and more particularly, to a thin film transistor.

2. Description of Related Art

With the development of the technology, minimization of electronic devices has become the trend. The present structure of the conventional metal-oxide thin film transistor (MO-TFT) is a bottom-gate-etching-stop structure. In the above structure, a source and a drain are located in the same layer and are respectively disposed on both sides of the semiconductor layer. An etching stop layer has two contact holes which expose a top surface of the semiconductor layer. The source and the drain respectively fill the two contact holes and are thus electrically connected to the semiconductor layer. However, the setting of the two contact holes is not conducive to reducing the size of TFT, and thus unable to meet the requirements of high resolution and narrow border of the display panels.

In order to meet the above requirements, a TFT in which a contact structure between a source and a semiconductor layer is different from a contact structure between a drain and the semiconductor layer has been developed. In this TFT structure, the source is covered with the semiconductor layer, and the drain is electrically connected to the semiconductor layer through the contact hole. However, different contact resistances may be formed in the different contact structures at the junction between metal and semiconductor above. Accordingly, the development of a TFT can meet the excellent electrical stability and the small size is necessary.

SUMMARY OF THE INVENTION

The invention provides a thin film transistor, which has characteristics of excellent electrical stability and small size.

The thin film transistor of the invention includes a gate, a gate insulating layer, a semiconductor layer, and a source and a drain. The gate insulating layer covers the gate. The semiconductor layer is located on the gate insulating layer which is disposed above the gate. The source and the drain are disposed above the gate insulating layer and are electrically connected to the semiconductor layer, respectively. The source and the drain are respectively located in different layers. A first contact resistance is existed between the semiconductor layer and the source, a second contact resistance is existed between the semiconductor layer and the drain, and the first contact resistance is less than the second contact resistance.

According to the above, in the thin film transistor in an embodiment of the invention, the source and the drain are respectively located in different layers and are electrically connected to the semiconductor layer, making size reducing of the thin film transistor possible. In addition, under a condition that a contact resistance between the source and the semiconductor layer is different from a contact resistance between the drain and the semiconductor layer, one with higher contact resistance is made as the drain, and the other one with lower contact resistance is made as the source. Accordingly, the thin film transistor has both excellent electrical stability and small size.

In order to make the aforementioned and other features and advantages of the invention comprehensible, embodiments accompanied with figures are described in detail below.

DESCRIPTION OF EMBODIMENTS

Figure 1:
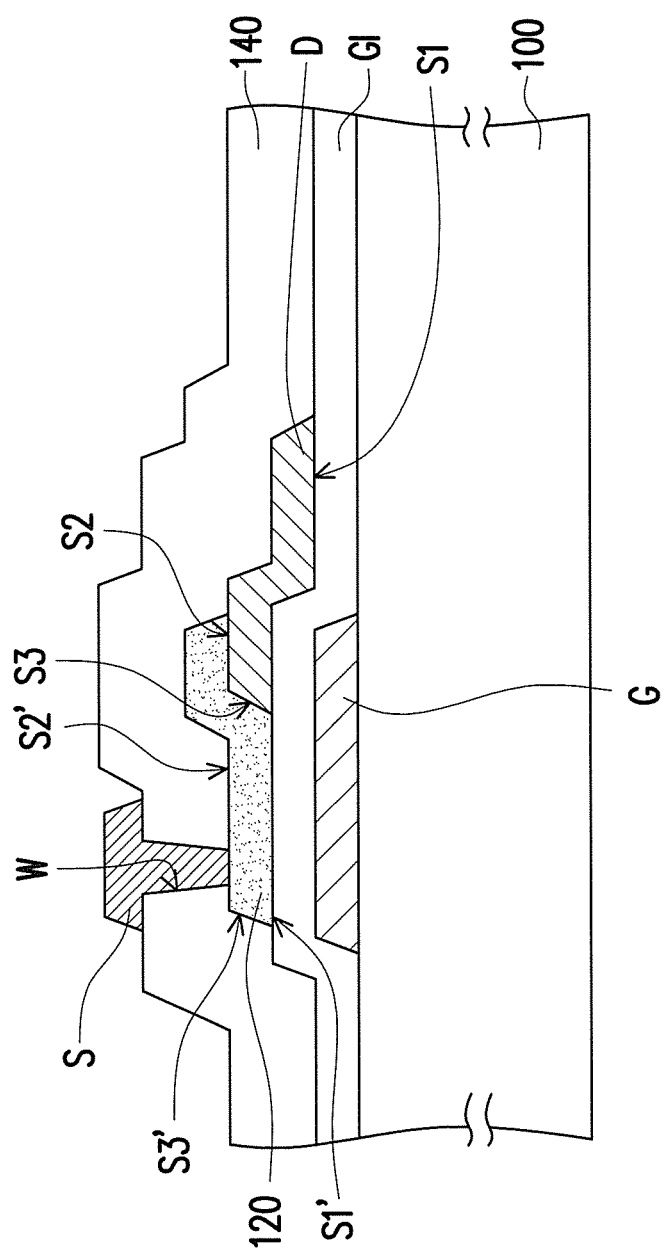
FIG. 1 illustrates a schematic sectional view of a thin film transistor according to the first embodiment of the invention.

FIG. 1 illustrates a schematic sectional view of a thin film transistor according to the first embodiment of the invention. Please refer to FIG. 1, a thin film transistor 10 of the present embodiment is disposed on the substrate 100. In terms of optical characteristics, the substrate 100 may be a transparent substrate or an opaque/reflective substrate. Materials of the transparent substrate may be selected from glass, quartz, organic polymers, other suitable materials, or combinations thereof. Materials of the opaque/reflective substrate may be selected from electrically conductive materials, metals, wafers, ceramic, other suitable materials, or combinations thereof. It should be noted that, when the substrate 100 is selectively made of the electrically conductive materials, an insulating layer (not shown) is required to be formed on the substrate 100 before the substrate 100 equipped with components of the thin film transistor, so as to prevent a problem of short circuit which is occurred between the substrate 100 and the components of thin film transistor. In terms of mechanical characteristics, the substrate 100 may be a rigid substrate or a flexible substrate. Materials of the rigid substrate may be selected from glass, quartz, electrically conductive materials, metals, wafers, ceramic, other suitable materials, or combinations thereof. Materials of the flexible substrate may be selected from ultra-thin glass, organic polymers such as plastics, other suitable materials, or combinations thereof.

The thin film transistor 10 of the present embodiment includes a gate G, a gate insulating layer GI, a semiconductor layer 120, an insulating layer 140, and a source S and a drain D.

As shown in FIG. 1, the gate G is disposed on the substrate 100. If the manufactured thin film transistor 10 is to applied to display fields, then scan lines (not shown) which are electrically connected to the gate G may further be formed at the same time with the formation of the gate G. Generally, the gate G is made of metal materials. However, the invention is not limited thereto, in other embodiments, the gate G may also be made of other electrically conductive materials such as alloys, metal nitrides, metal oxides, metal oxynitrides, or combinations thereof.

As shown in FIG. 1, the gate G and the substrate 100 is covered with the gate insulating layer GI. Materials of the gate insulating layer GI may be inorganic materials, organic materials, or combinations of these materials. The inorganic materials are, for example, silicon oxides, silicon nitrides, silicon oxynitrides, but the invention is not limited thereto.

The drain D is disposed on the gate insulating layer GI. Materials of the drain D are metals. However, the invention is not limited thereto, in other embodiments, the drain D may also be made of other electrically conductive materials such as alloys, metal nitrides, metal oxides, metal oxynitrides, or combinations thereof. The drain D has a bottom surface S1 facing toward the gate insulating layer GI, a top surface S2 facing away from the bottom surface S1, and at least one side surface S3 connecting the bottom surface S1 and the top surface S2.

The semiconductor layer 120 is located on the gate insulating layer GI and disposed above the gate G. In the present embodiment, the semiconductor layer 120 is an integral pattern without contact holes. In the present embodiment, materials of the semiconductor layer 120 may be metal oxide semiconductors such as indium-gallium-zinc oxide (IGZO), zinc oxide (ZnO), indium-zinc oxide (IZO), gallium-zinc oxide (GZO), zinc-tin oxide (ZTO), indium-tin oxide (ITO), nickel cobalt oxide ($NiCo_2O_4$), but the invention is not limited thereto. In other embodiments, materials of the semiconductor layer 120 may also be amorphous silicon, monocrystalline silicon, polycrystalline silicon, or other suitable materials. As shown in FIG. 1, the semiconductor layer 120 covers the top surface S2 and the at least one side surface S3 of the drain D. In other words, in the present embodiment, a contact structure between the drain D and the semiconductor layer 120 is a coplanar structure, wherein the drain D may be electrically connected to the semiconductor layer 120 through the structure. The semiconductor layer 120 has a bottom surface S1' facing toward the gate insulating layer GI, a top surface S2' facing away from the bottom surface S1', and at least one side surface S3' connecting the bottom surface S1' and the top surface S2'.

The source S is disposed above the gate insulating layer GI. The Material of the source S is metals. However, the invention is not limited thereto, in other embodiments, the source S may be also made of other electrically conductive materials such as alloys, metal nitrides, metal oxides, metal oxynitrides, or combinations thereof.

The insulating layer 140 is disposed between the source S and the semiconductor layer 120. The insulating layer 140 has a contact hole W. In the present embodiment, the top surface S2' of the semiconductor layer 120 is exposed by the contact hole W of the insulating layer 140. The source S fills the contact hole W of the insulating layer 140 by which the source S is electrically connected to the semiconductor layer 120.

It is worth mentioning that, in the present embodiment, the contact structure between the source S and the semiconductor layer 120 is different from the contact structure between the drain D and the semiconductor layer 120. Accordingly, a first contact resistance is existed between the source S and the semiconductor layer 120, a second contact resistance is existed between the drain D and the semiconductor layer 120, and the first contact resistance is different from the second contact resistance. Based on a view of enhancing the electrical stability of the thin film transistor 10, the first contact resistance is preferably less than the second contact resistance. That is, in the thin film transistor 10 of the present embodiment, the electrical stability of the thin film transistor 10 may be enhanced by disposing the source S and the semiconductor layer 120 in a way that the contact resistance of the junction therebetween is lower.

Figure 2:
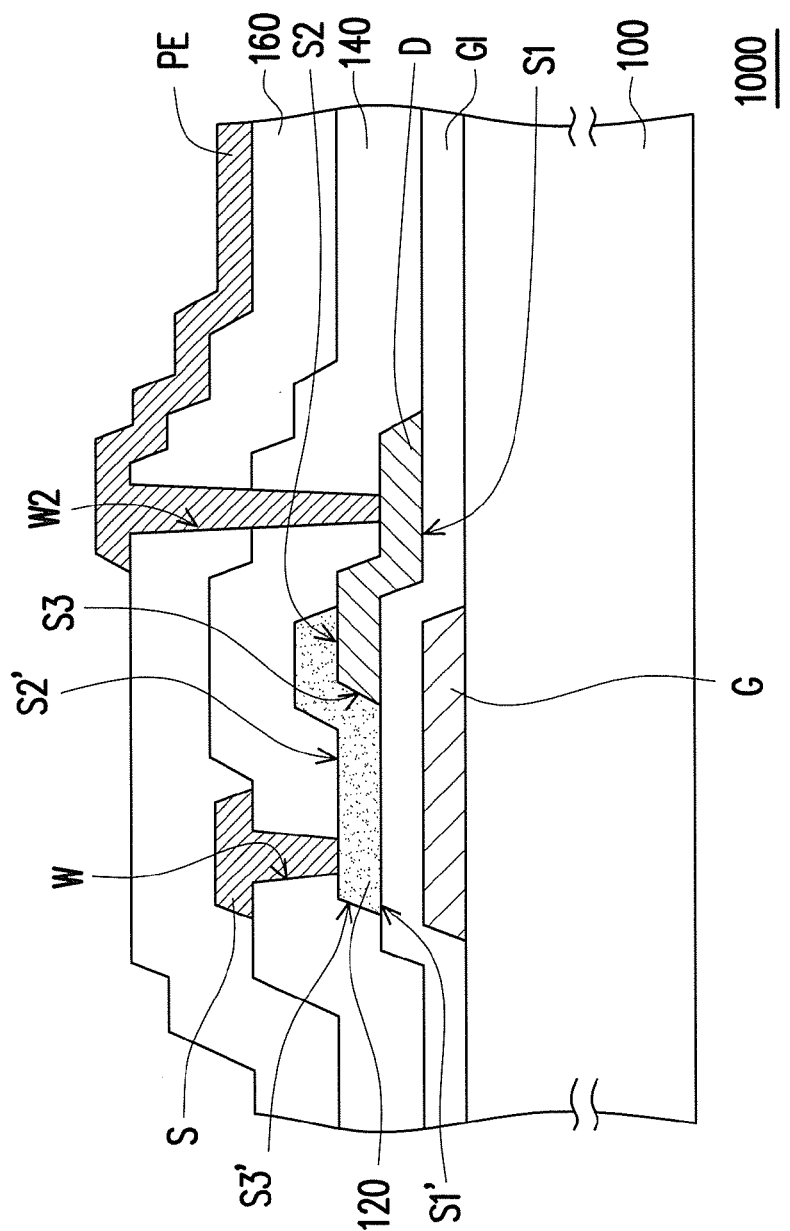
FIG. 2 illustrates a schematic sectional view of a pixel structure with the thin film transistor in FIG. 1.

FIG. 2 illustrates a schematic sectional view of a pixel structure with the thin film transistor in FIG. 1. Please refer to FIG. 2, the pixel structure 1000 may be applied to any suitable electronic apparatuses such as a liquid crystal display (LCD) and an organic light emitting diode (OLED). Under a condition that the pixel structure 1000 is applied to the display panel, data lines (not shown) which are electrically connected to the source S may be formed at the same time with the formation of the source S of the thin film transistor 10, further, scan lines (not shown) which are electrically connected to the gate G may be formed at the same time with the formation of the gate G of the thin film transistor 10. In addition, as shown in FIG. 2, the pixel electrode PE is electrically connected to the drain D through the contact hole W2. A protective layer 160 is disposed between the source S and the pixel electrode PE such that the source S and the pixel electrode PE are electrically isolated from one another.

Figure 3:
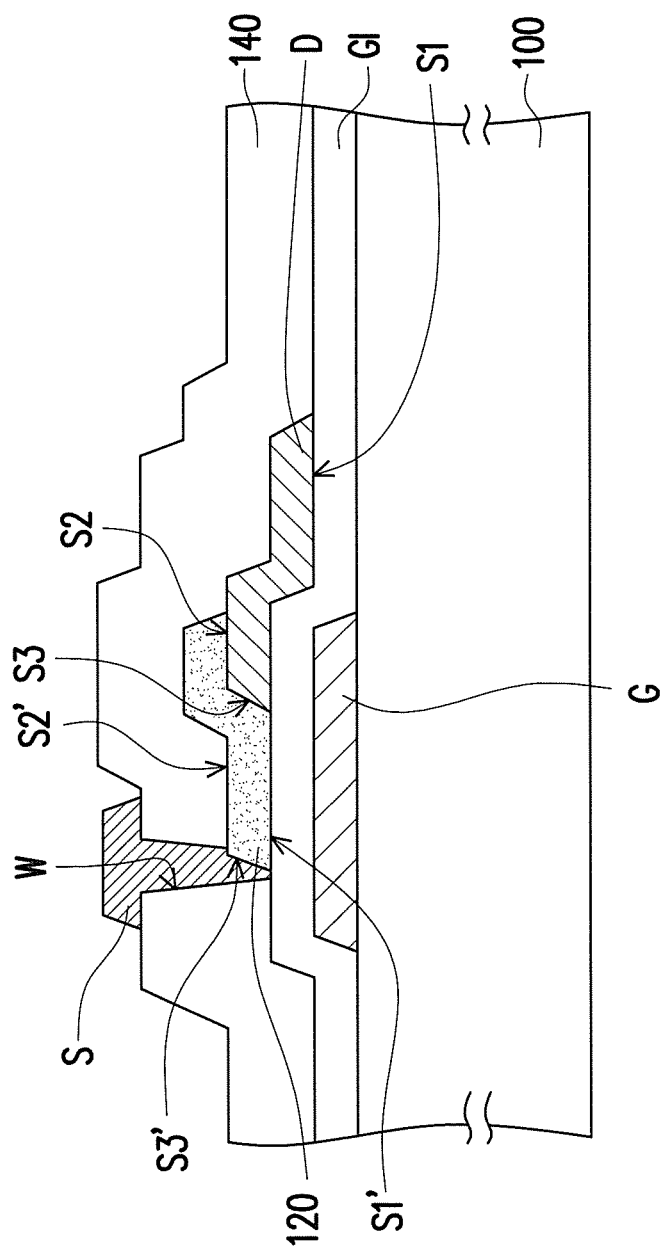
FIG. 3 illustrates a schematic sectional view of a thin film transistor according to the second embodiment of the invention.

FIG. 3 illustrates a schematic sectional view of a thin film transistor according to the second embodiment of the invention. Please refer to FIG. 3, the thin film transistor 20 is similar to the thin film transistor 10 in FIG. 1. The same or similar components are represented by the same or similar symbols, and are not illustrated again. The difference between the thin film transistor 20 and the thin film transistor 10 is that the top surface S2' and the at least one side surface S3' of the semiconductor layer 120 are exposed by the contact hole W of the insulating layer 140.

Similarly, in the present embodiment, the source S is electrically connected to the semiconductor layer 120 through the contact hole W, and the semiconductor layer 120 covers the top surface S2 and the at least one side surface S3 of the drain D to electrically connected to one another. The contact structure between the source S and the semiconductor layer 120 is different from the contact structure between the drain D and the semiconductor layer 120. Accordingly, between the source S and the semiconductor layer 120 has the first contact resistance, and between the drain D and the semiconductor layer 120 has the second contact resistance, wherein the first contact resistance is different from the second contact resistance. Based on a view of enhancing the electrical stability of the thin film transistor 20, the first contact resistance is preferably less than the second contact resistance. That is, in the thin film transistor 20 of the present embodiment, the electrical stability of the thin film transistor 20 may be enhanced by disposing the source S and the semiconductor layer 120 in a way that the contact resistance of the junction therebetween is lower.

Figure 4:
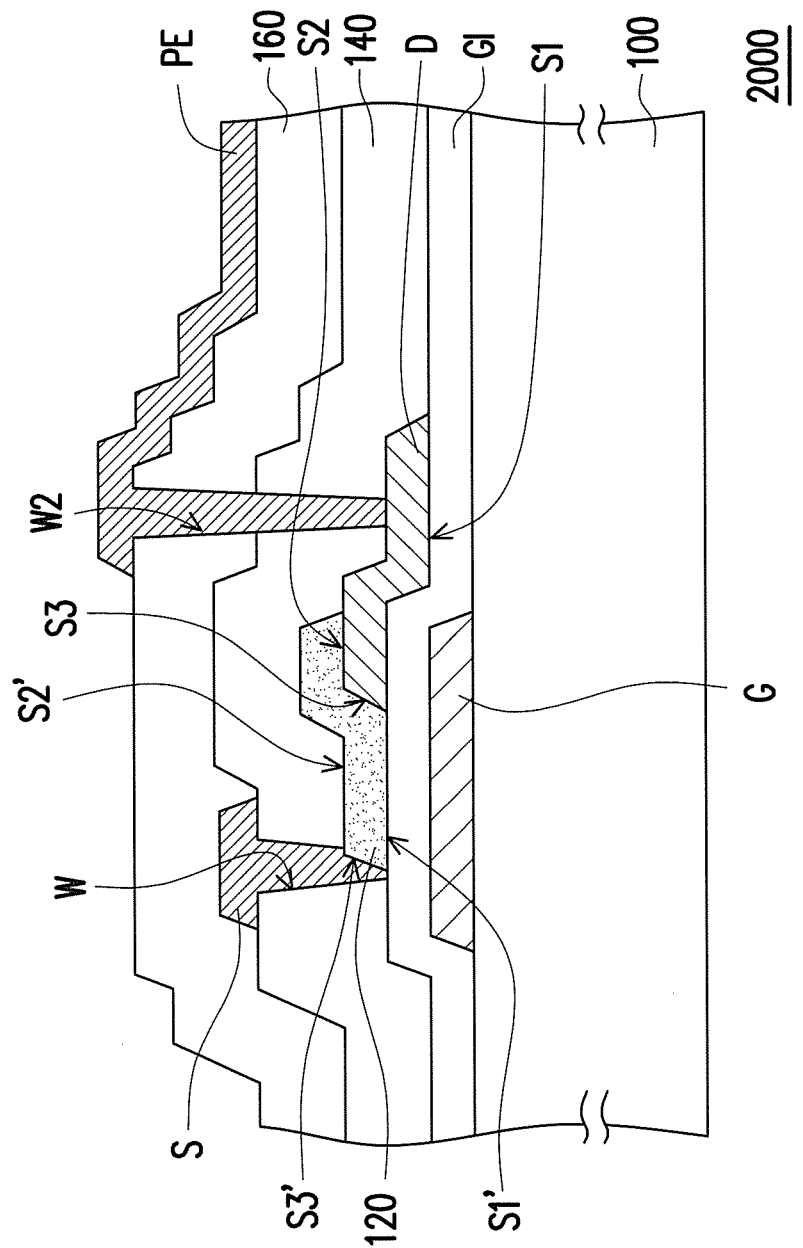
FIG. 4 illustrates a schematic sectional view of a pixel structure with the thin film transistor in FIG. 3.

FIG. 4 illustrates a schematic sectional view of a pixel structure with the thin film transistor in FIG. 3. Please refer to FIG. 4, the pixel structure 2000 may be applied to any suitable electronic apparatuses such as LCDs and OLEDs. Under a condition that the pixel structure 2000 is applied to the display panel, the data lines (not shown) which are electrically connected to the source S may be formed at the same time with the formation of the source S of the thin film transistor 20, further, the scan lines (not shown) which are electrically connected to the gate G may be formed at the same time with the formation of the gate G of the thin film transistor 20. In addition, as shown in FIG. 4, the pixel electrode PE is electrically connected to the drain D through the contact hole W2. The protective layer 160 is disposed between the source S and the pixel electrode PE such that the source S and the pixel electrode PE are electrically isolated from one another.

Figure 5:
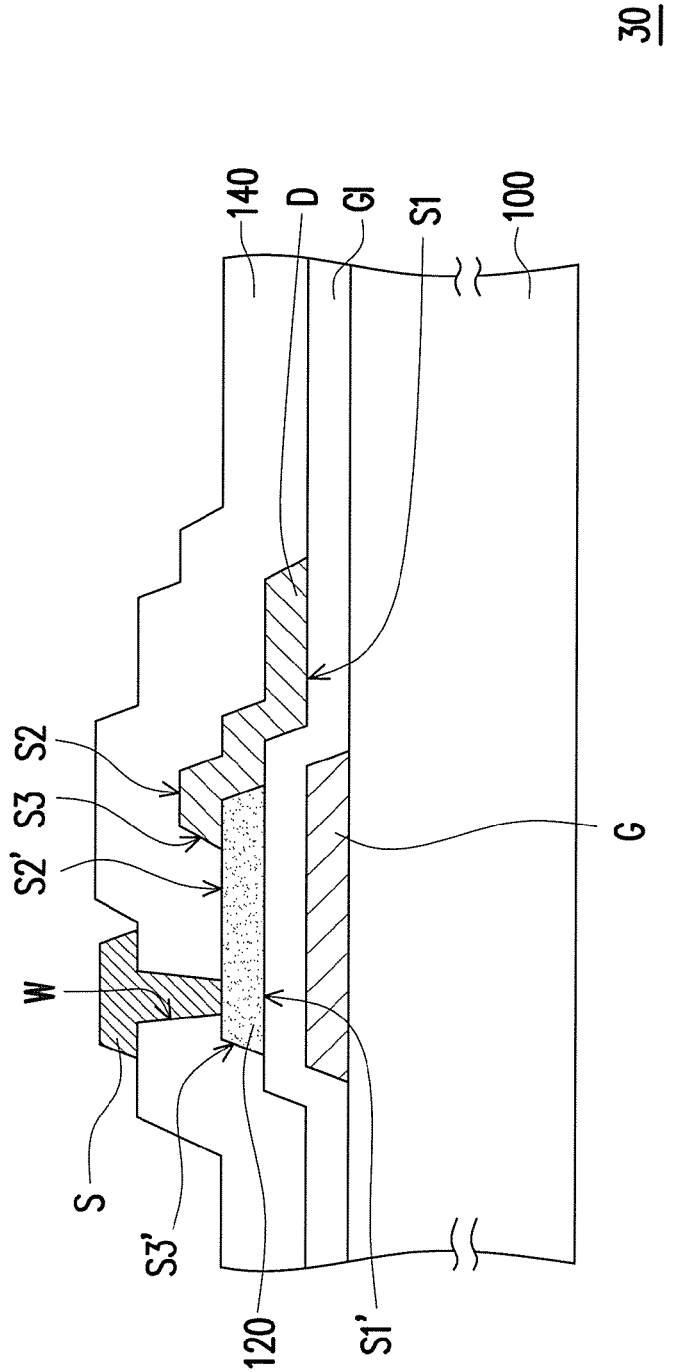
FIG. 5 illustrates a schematic sectional view of a thin film transistor according to the third embodiment of the invention.

FIG. 5 illustrates a schematic sectional view of a thin film transistor according to the third embodiment of the invention. Please refer to FIG. 5, components of the thin film transistor 30 which are the same as or similar to the components of the thin film transistor 10 in FIG. 1 are represented by the same or similar symbols, and are not illustrated again. The semiconductor layer 120 is located on the gate insulating layer GI and is disposed above the gate G. The semiconductor layer 120 has the bottom surface S1' facing toward the gate insulating layer GI, the top surface S2' facing away from the bottom surface S1', and the at least one side surface S3' connecting the bottom surface S1' and the top surface S2'. The insulating layer 140 is disposed between the source S and the semiconductor layer 120. The insulating layer 140 has the contact hole W. The top surface S2' of the semiconductor layer 120 is exposed by the contact hole W of the insulating layer 140. The source S fills the contact hole W of the insulating layer 140 by which the source S is electrically connected to the semiconductor layer 120. The difference between the thin film transistor 30 and the thin film transistor 10 is that the drain D is disposed between the insulating layer 140 and the semiconductor layer 120. More specifically, the drain D covers the top surface S2' and the at least one side surface S3' of the semiconductor layer 120 such that the drain D and the semiconductor layer 120 are electrically connected to one another.

It is worth mentioning that, in the present embodiment, the contact structure between the source S and the semiconductor layer 120 is different from the contact structure between the drain D and the semiconductor layer 120. Accordingly, the first contact resistance is existed between the source S and the semiconductor layer 120, the second contact resistance is existed between the drain D and the semiconductor layer 120, and the first contact resistance is different from the second contact resistance. Based on a view of enhancing the electrical stability of the thin film transistor 30, the first contact resistance is preferably less than the second contact resistance. That is, in the thin film transistor 30 of the present embodiment, the electrical stability of the thin film transistor 30 may be enhanced by disposing the source S and the semiconductor layer 120 in a way that the contact resistance of the junction therebetween is lower.

Figure 6:
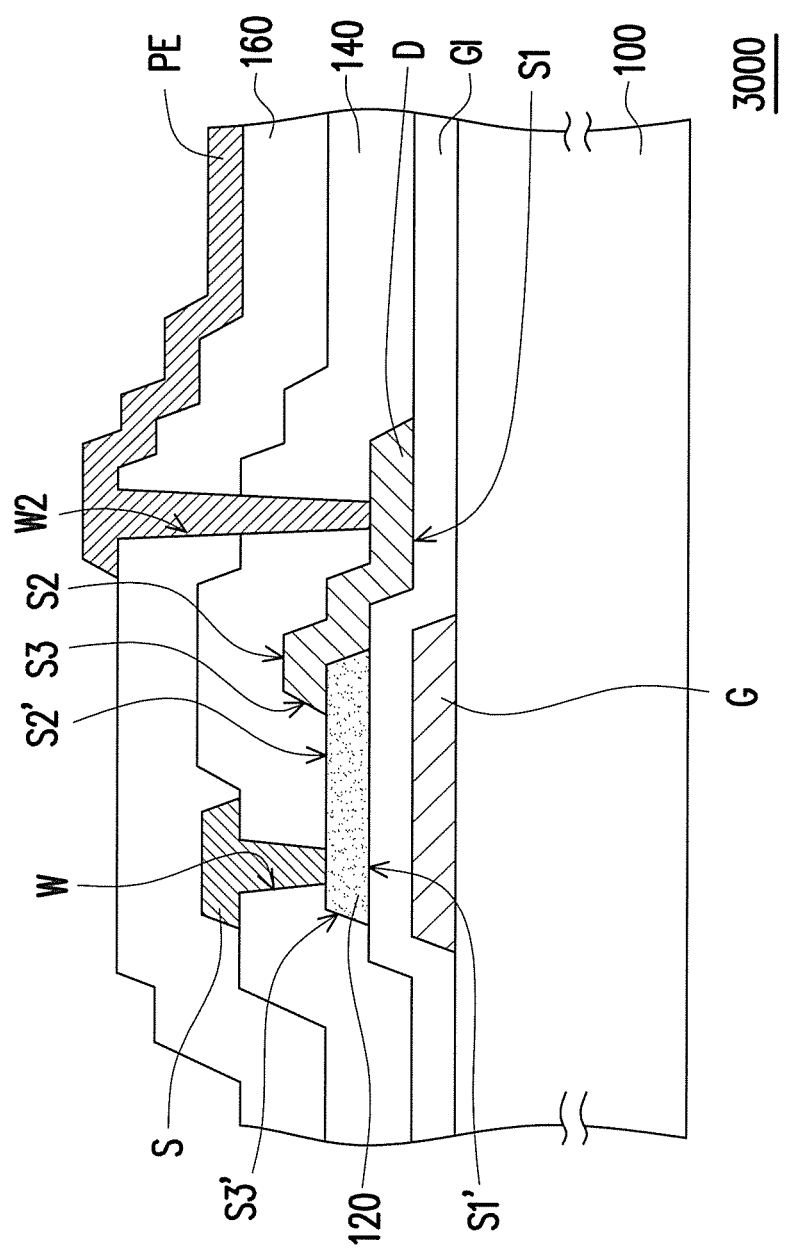
FIG. 6 illustrates a schematic sectional view of a pixel structure with the thin film transistor in FIG. 5.

FIG. 6 illustrates a schematic sectional view of a pixel structure with the thin film transistor in FIG. 5. Please refer to FIG. 6, in the present embodiment, the pixel structure 3000 may be applied to any suitable electronic apparatuses such as LCDs and OLEDs. Under a condition that the pixel structure 3000 is applied to the display panel, the data lines (not shown) which are electrically connected to the source S may be formed at the same time with the formation of the source S of the thin film transistor 30, further, the scan lines (not shown) which are electrically connected to the gate G may be formed at the same time with the formation of the gate G of the thin film transistor 30. In addition, as shown in FIG. 6, the pixel electrode PE is electrically connected to the drain D through the contact hole W2. The protective layer 160 is disposed between the source S and the pixel electrode PE such that the source S and the pixel electrode PE are electrically isolated from one another.

Figure 7:
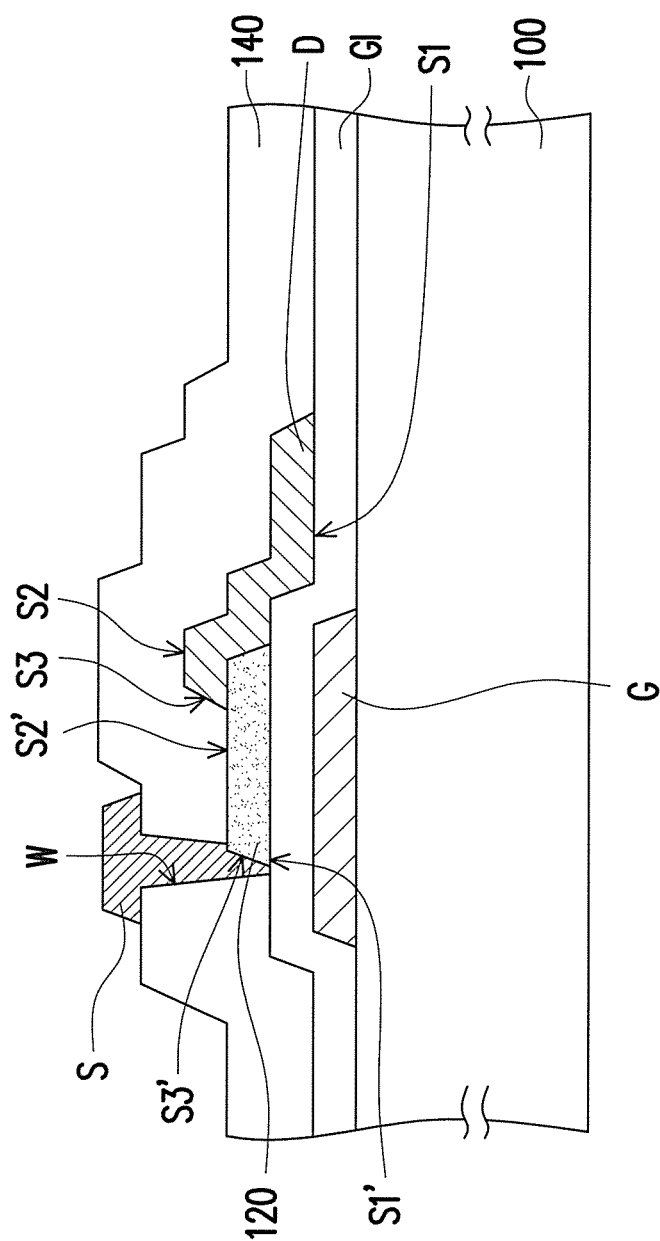
FIG. 7 illustrates a schematic sectional view of a thin film transistor according to the fourth embodiment of the invention.

FIG. 7 illustrates a schematic sectional view of a thin film transistor according to the fourth embodiment of the invention. Please refer to FIG. 7, components of the thin film transistor 40 which are the same as or similar to the components of the thin film transistor 10 in FIG. 1 are represented by the same or similar symbols, and are not illustrated again. The semiconductor layer 120 is located on the gate insulating layer GI and is disposed above the gate G. The semiconductor layer 120 has the bottom surface S1' facing toward the gate insulating layer GI, the top surface S2' facing away from the bottom surface S1', and the at least one side surface S3' connecting the bottom surface S1' and the top surface S2'. The insulating layer 140 is disposed between the source S and the semiconductor layer 120. The insulating layer 140 has the contact hole W. In particular, the top surface S2' and the at least one side surface S3' of the semiconductor layer 120 are exposed by the contact hole W of the insulating layer 140. The source S fills the contact hole W of the insulating layer 140 by which the source S is electrically connected to the semiconductor layer 120. In the present embodiment, the drain D is disposed between the insulating layer 140 and the semiconductor layer 120. More specifically, the drain D covers the top surface S2' and the at least one side surface S3' of the semiconductor layer 120 such that the drain D and the semiconductor layer 120 are electrically connected to one another.

It is worth mentioning that, in the present embodiment, the contact structure between the source S and the semiconductor layer 120 is different from the contact structure between the drain D and the semiconductor layer 120. Accordingly, the first contact resistance is existed between the source S and the semiconductor layer 120, the second contact resistance is existed between the drain D and the semiconductor layer 120, and the first contact resistance is different from the second contact resistance. Based on a view of enhancing the electrical stability of the thin film transistor 40, the first contact resistance is preferably less than the second contact resistance. That is, in the thin film transistor 40 of the present embodiment, the electrical stability of the thin film transistor 40 may be enhanced by disposing the source S and the semiconductor layer 120 in a way that the contact resistance of the junction therebetween is lower.

Figure 8:
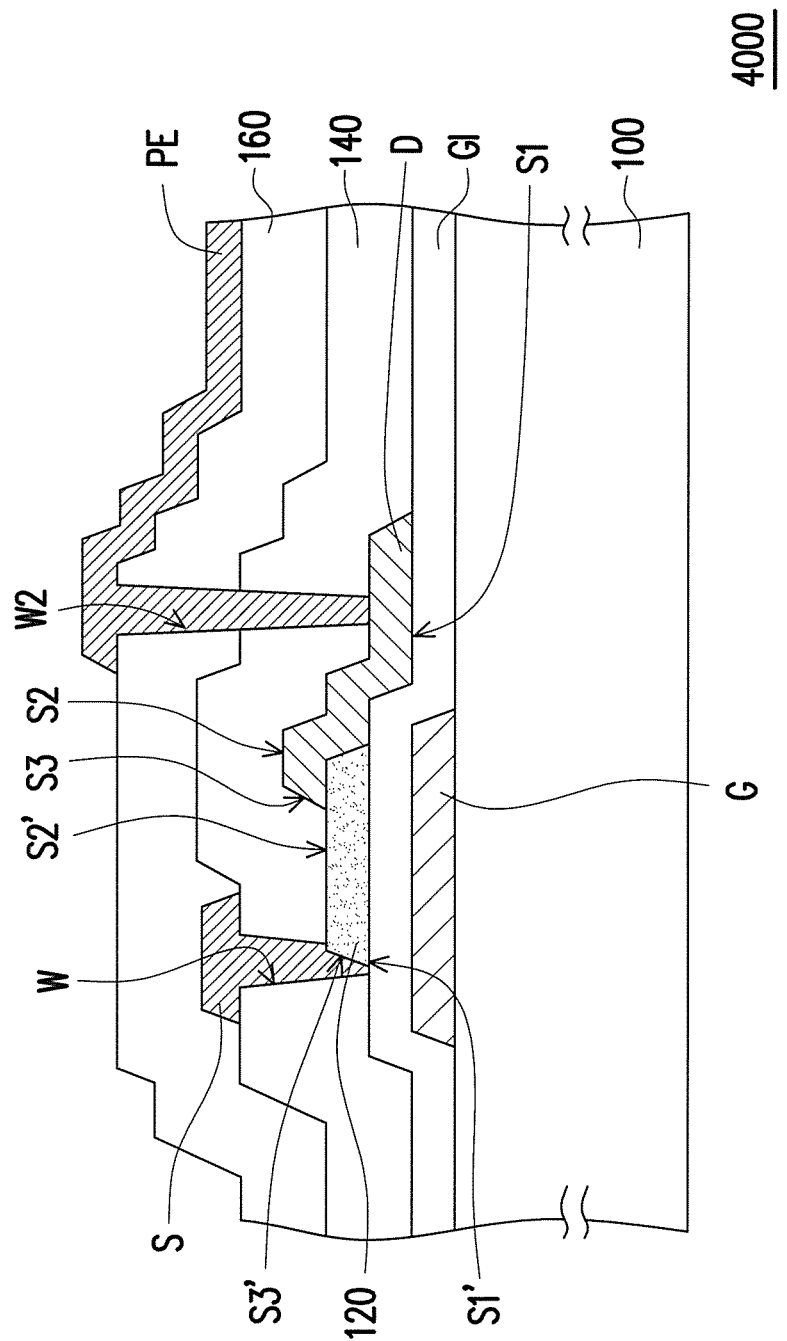
FIG. 8 illustrates a schematic sectional view of a pixel structure with the thin film transistor in FIG. 7.

FIG. 8 illustrates a schematic sectional view of a pixel structure with the thin film transistor in FIG. 7. Please refer to FIG. 8, the pixel structure 4000 may be applied to any suitable electronic apparatuses such as LCDs and OLEDs. Under a condition that the pixel structure 4000 is applied to the display panel, the data lines (not shown) which are electrically connected to the source S may be formed at the same time with the formation of the source S of the thin film transistor 40, further, the scan lines (not shown) which are electrically connected to the gate G may be formed at the same time with the formation of the gate G of the thin film transistor 40. In addition, as shown in FIG. 8, the pixel electrode PE is electrically connected to the drain D through the contact hole W2. The protective layer 160 is disposed between the source S and the pixel electrode PE such that the source S and the pixel electrode PE are electrically isolated from one another.

Figure 9:
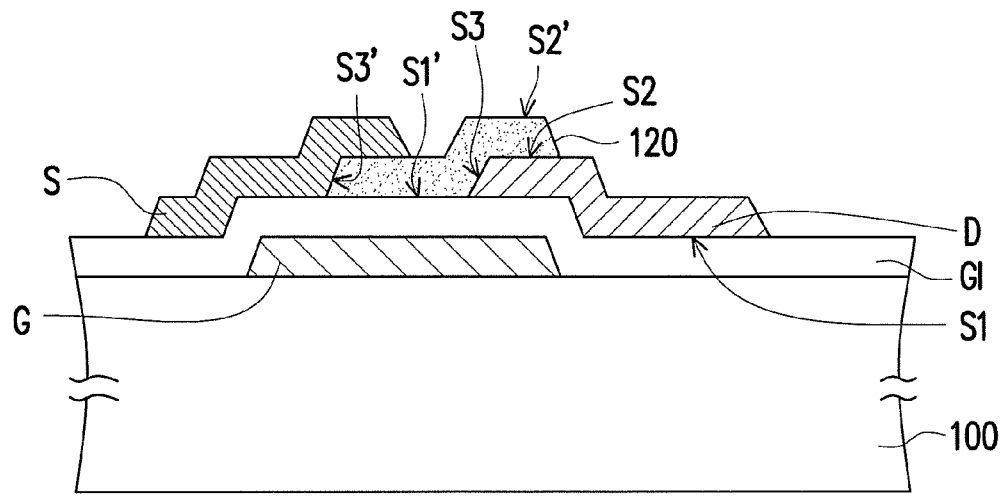
FIG. 9 illustrates a schematic sectional view of a thin film transistor according to the fifth embodiment of the invention.

FIG. 9 illustrates a schematic sectional view of a thin film transistor according to the fifth embodiment of the invention. Please refer to FIG. 9, components of the thin film transistor 50 which are the same as or similar to the components of the thin film transistor 10 in FIG. 1 are represented by the same or similar symbols, and are not illustrated again. The semiconductor layer 120 is located on the gate insulating layer GI and is disposed above the gate G. The semiconductor layer 120 has the bottom surface S1' facing toward the gate insulating layer GI, the top surface S2' facing away from the bottom surface S1', and the at least one side surface S3' connecting the bottom surface S1' and the top surface S2'. In particular, the top surface S2' and the at least one side surface S3' of the semiconductor layer 120 are covered with the source S, by which the source S is electrically connected to the semiconductor layer 120. The drain D has the bottom surface S1 facing toward the gate insulating layer GI, the top surface S2 facing away from the bottom surface S1, and the at least one side surface S3 connecting the bottom surface S1 and the top surface S2. The semiconductor layer 120 covers the top surface S2 and the at least one side surface S3 of the drain D, by which the drain D is electrically connected to the semiconductor layer 120.

It is worth mentioning that, in the present embodiment, the contact structure between the source S and the semiconductor layer 120 is different from the contact structure between the drain D and the semiconductor layer 120. Accordingly, the first contact resistance is existed between the source S and the semiconductor layer 120, and the second contact resistance is existed between the drain D and the semiconductor layer 120, and the first contact resistance is different from the second contact resistance. Based on a view of enhancing the electrical stability of the thin film transistor 50, the first contact resistance is preferably less than the second contact resistance. That is, in the thin film transistor 50 of the present embodiment, the electrical stability of the thin film transistor 50 may be enhanced by disposing the source S and the semiconductor layer 120 in a way that the contact resistance of the junction therebetween is lower.

Figure 10:
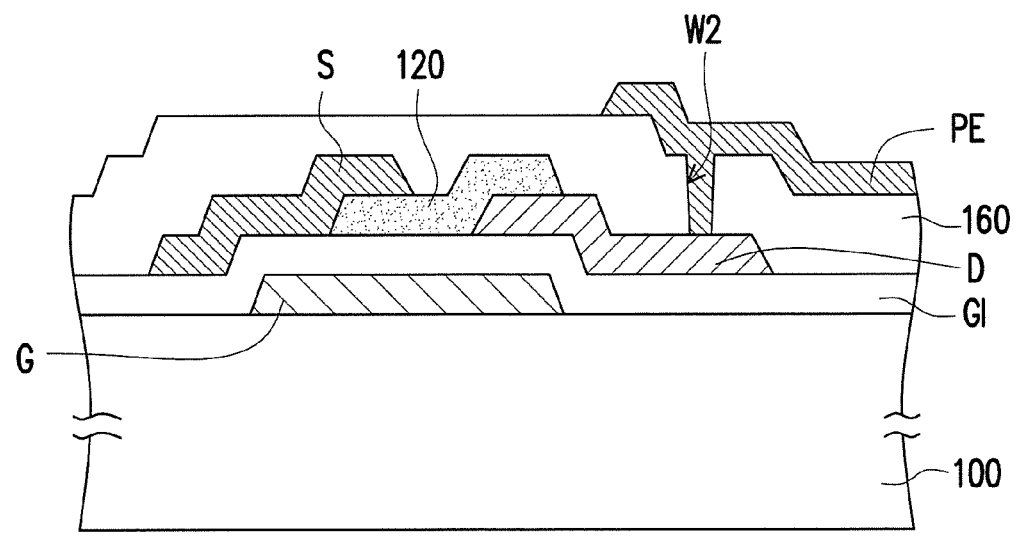
FIG. 10 illustrates a schematic sectional view of a pixel structure with the thin film transistor in FIG. 9.

FIG. 10 illustrates a schematic sectional view of a pixel structure with the thin film transistor in FIG. 9. Please refer to FIG. 10, in the present embodiment, the pixel structure 5000 may be applied to any suitable electronic apparatuses such as LCDs and OLEDs. Under a condition that the pixel structure 5000 is applied to the display panel, data lines (not shown) which are electrically connected to the source S may be formed at the same time with the formation of the source S of the thin film transistor 50, further, scan lines (not shown) which are electrically connected to the gate G may be formed at the same time with the formation of the gate G of the thin film transistor 50. In addition, as shown in FIG. 10, the pixel electrode PE is electrically connected to the drain D through the contact hole W2. The protective layer 160 is disposed between the source S and the pixel electrode PE such that the source S and the pixel electrode PE are electrically isolated from one another.

The electrical stability of the thin film transistor 10 in FIG. 1 of the invention is compared to the electrical stability of the conventional thin film transistor with reference to following figures. It should be noted that, the difference between the thin film transistor 10 and the conventional thin film transistor is that, the source and the semiconductor layer of the thin film transistor 10 are disposed in a way that the contact resistance of the junction therebetween is lower, and the drain and the semiconductor layer of the thin film transistor 10 are disposed in a way that the contact resistance of the junction therebetween is higher. In contrast, the source and the semiconductor layer of the conventional thin film transistor are disposed in a way that the contact resistance of the junction therebetween is higher, and the drain and the semiconductor layer of the conventional thin film transistor are disposed in a way that the contact resistance of the junction therebetween is lower.

Figure 11:
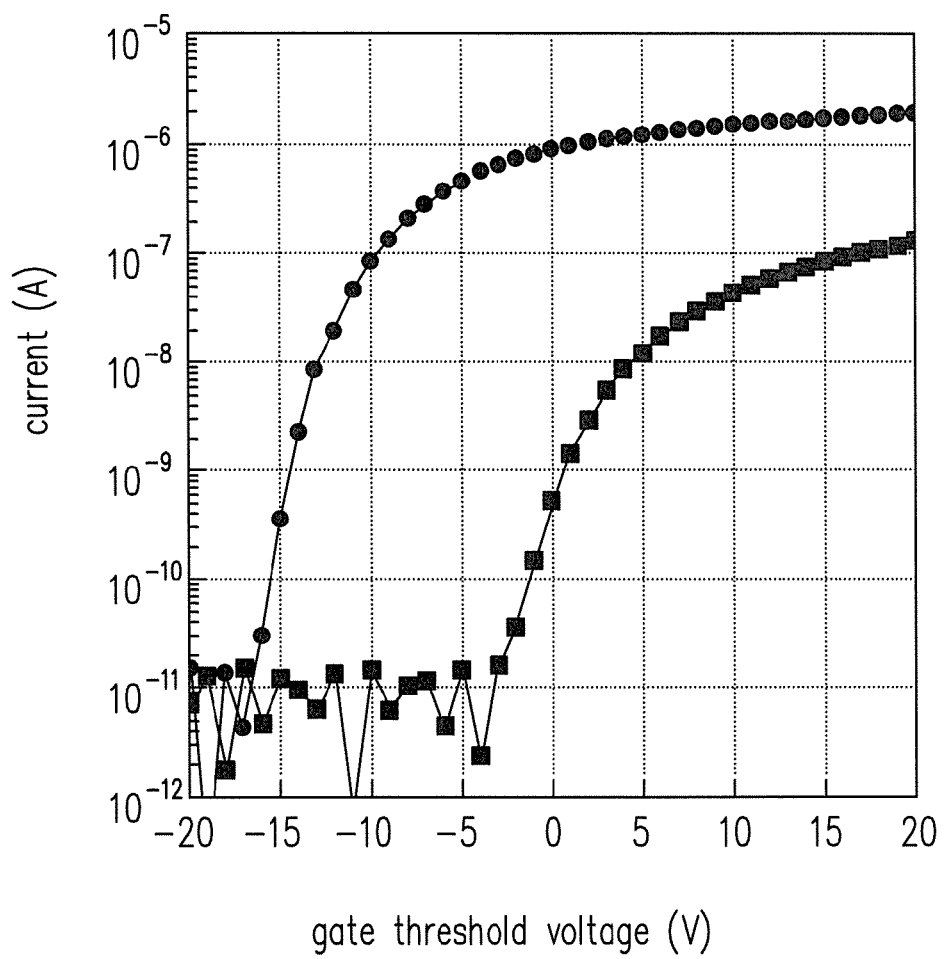
FIG. 11 illustrates a current-voltage graph of a conventional thin film transistor.
Figure 12:
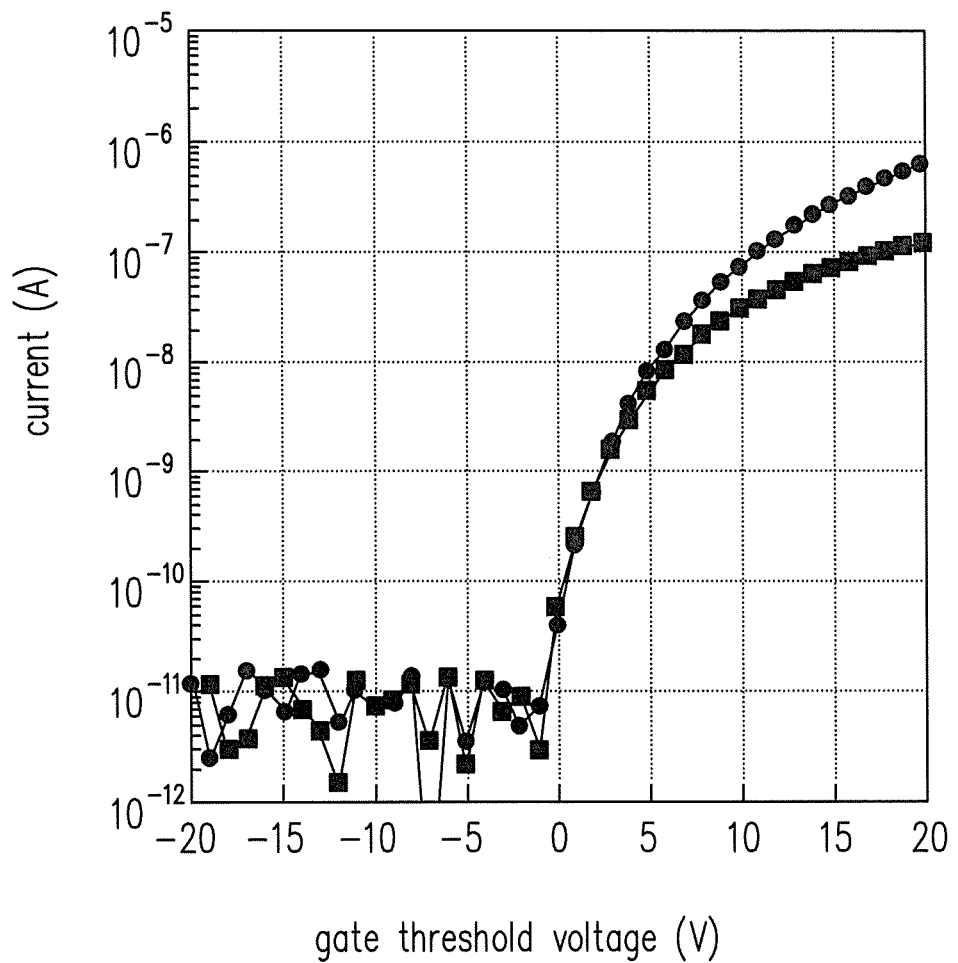
FIG. 12 illustrates a current-voltage graph of the thin film transistor in FIG. 1.

FIG. 11 illustrates a current-voltage graph of a conventional thin film transistor. FIG. 12 illustrates a current-voltage graph of the thin film transistor in FIG. 1. Please refer to FIG. 11 and FIG. 12 simultaneously. The vertical axis represents the current (A), and the horizontal axis represents the gate threshold voltage (V). As shown in FIG. 11, for the conventional thin film transistor, under conditions that an operating voltage of 10V (dot curve) and an operating voltage of 1V (square point curve) are respectively provided, the gate threshold voltages thereof are greatly different from each other (about 15V). In particular, for the thin film transistor 10 in the first embodiment of the invention, under the conditions that the operating voltage of 10V (dot curve) and the operating voltage of 1V (square point curve) are respectively provided, the gate threshold voltages thereof are substantially the same. According to this, the electrical stability of the thin film transistor may be enhanced by disposing the source and the semiconductor layer in a way that the contact resistance of the junction therebetween is lower.

According to the above, in the thin film transistor in the embodiment of the invention, the source and the drain are respectively located in different layers. Accordingly, the amount of the contact holes in the thin film transistor may be reduced, and the source and the drain may be electrically connected to the semiconductor layer even without the need of the contact holes, making the size reducing of the thin film transistor possible. In addition, under the condition that the contact resistance between the source and the semiconductor layer is different from the contact resistance between the drain and the semiconductor layer, the source and the semiconductor layer are disposed in a way that the contact resistance of the junction therebetween is lower, and the drain and the semiconductor layer are disposed in a way that the contact resistance of the junction therebetween is higher. Accordingly, the thin film transistor may have much better electrical stability.

What is claimed is:

1. A thin film transistor, comprising:
    a gate;
    a gate insulating layer, covering the gate;
    a semiconductor layer, located on the gate insulating layer and disposed above the gate; and
    a source and a drain, disposed above the gate insulating layer and electrically connected to the semiconductor layer, the source and the drain being formed of same material; and
    an insulating layer, disposed between the source and the semiconductor layer, wherein the insulating layer has a contact hole exposing the semiconductor layer, the source fills the contact hole of the insulating layer and is electrically connected to the semiconductor layer, and the drain is disposed between the insulating layer and the semiconductor layer,
    wherein the source and the drain are respectively located in different layers, the insulating layer is a single-layer structure, a first contact resistance is existed between the source and the semiconductor layer, a second contact resistance is existed between the drain and the semiconductor layer, and the first contact resistance is less than the second contact resistance.

2. The thin film transistor as claimed in claim 1, wherein the semiconductor layer has a bottom surface facing toward the gate insulating layer, a top surface facing away from the bottom surface, and at least one side surface connecting the bottom surface and the top surface, the contact hole of the insulating layer exposes the top surface of the semiconductor layer, and the insulating layer covers the side surface of the semiconductor layer.

3. The thin film transistor as claimed in claim 1, wherein the semiconductor layer has a bottom surface facing toward the gate insulating layer, a top surface facing away from the bottom surface, and at least one side surface connecting the bottom surface and the top surface, and the contact hole of the insulating layer exposes the top surface and the at least one side surface of the semiconductor layer.

4. The thin film transistor as claimed in claim 1, wherein the semiconductor layer has a bottom surface facing toward the gate insulating layer, a top surface facing away from the bottom surface, and at least one side surface connecting the bottom surface and the top surface, and the drain covers the top surface and the at least one side surface of the semiconductor layer.

* * * * *